United States Patent
Bellaouar et al.

(10) Patent No.: US 8,493,136 B2
(45) Date of Patent: Jul. 23, 2013

(54) DRIVER CIRCUIT AND A MIXER CIRCUIT RECEIVING A SIGNAL FROM THE DRIVER CIRCUIT

(75) Inventors: Abdellatif Bellaouar, Richardson, TX (US); See Taur Lee, Allen, TX (US)

(73) Assignee: Icera Inc., Wilmington, DE (US)

( * ) Notice: Subject to any disclaimer, the term of this patent is extended or adjusted under 35 U.S.C. 154(b) by 212 days.

(21) Appl. No.: 13/083,188

(22) Filed: Apr. 8, 2011

(65) Prior Publication Data

US 2012/0256676 A1    Oct. 11, 2012

(51) Int. Cl.
    *G05F 1/10*    (2006.01)
(52) U.S. Cl.
    USPC ............................................ 327/540; 327/541
(58) Field of Classification Search
    USPC ................. 327/355, 530, 538, 539, 540, 541
    See application file for complete search history.

(56) References Cited

U.S. PATENT DOCUMENTS

| | | | |
|---|---|---|---|
| 5,235,222 A * | 8/1993 | Kondoh et al. | 326/83 |
| 5,815,027 A * | 9/1998 | Tihanyi et al. | 327/543 |
| 6,133,780 A * | 10/2000 | Chi | 327/541 |
| 6,181,170 B1 * | 1/2001 | Koifman | 327/108 |
| 6,587,001 B1 | 7/2003 | Wyles et al. | |
| 6,897,714 B2 * | 5/2005 | Mori | 327/541 |
| 7,102,411 B2 * | 9/2006 | Behzad | 327/359 |
| 7,705,663 B2 * | 4/2010 | Wadatsumi et al. | 327/543 |

FOREIGN PATENT DOCUMENTS

| | | |
|---|---|---|
| JP | 6110305 A | 1/1986 |
| JP | 200613631 A | 1/2006 |
| WO | 2010025556 A1 | 3/2010 |

OTHER PUBLICATIONS

Combined Search and Examination Report, Application No. GB1206006.7, Applicant: Icera LLC, Jul. 18, 2012, 6 pages.

* cited by examiner

*Primary Examiner* — Hai L Nguyen

(57) ABSTRACT

A driver circuit for supplying a drive signal to a mixer circuit comprising a first and second circuit branch and an operational amplifier. The first circuit branch receives an input signal and a bias signal. The second circuit branch receives the input signal. The operational amplifier has a first input connected to a junction node of the first circuit branch and a second input connected to a junction node of the second circuit branch. The operational amplifier is arranged to provide an operational amplifier output signal a second component of the second circuit branch so that a voltage at the junction node of the second circuit branch is equal to a voltage at the junction node of the first circuit branch. The voltage is dependent on the input signal and providing the drive signal.

15 Claims, 5 Drawing Sheets

DRIVER CIRCUIT AND A MIXER CIRCUIT RECEIVING A SIGNAL FROM THE DRIVER CIRCUIT

FIELD OF THE INVENTION

This invention relates to a mixer for frequency conversion in a transceiver and to a driver circuit therefore.

BACKGROUND

Wireless devices have been in use for many years for enabling mobile communication of voice and data. Such devices can include mobile phones and wireless enabled personal digital assistants (PDA's) for example. FIG. 1 is a generic block diagram of the core components of such wireless devices. The wireless core 10 includes a base band processor 12 for controlling application specific functions of the wireless device and for providing and receiving voice or data signals to a radio frequency (RF) transceiver chip 14. The RF transceiver chip 14 is responsible for frequency up-conversion of transmission signals, and frequency down-conversion of received signals. RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art should understand that FIG. 1 is a simplified block diagram, and can include other functional blocks that may be necessary to enable proper operation or functionality.

Generally, the transmitter core 20 is responsible for up-converting electromagnetic signals from baseband to higher frequencies for transmission, while receiver core 16 is responsible for down-converting those high frequencies back to their original frequency band when they reach the receiver, processes known as up-conversion and down-conversion respectively. The original (or baseband) signal, may represent, for example, data, voice, or video. These baseband signals may be produced by transducers such as microphones or video cameras, be computer generated, or transferred from an electronic storage device.

FIG. 2 illustrates an example transmit path through the transmitter core 20 to the antenna 18. As shown in FIG. 2, the transmit path may include a mixer 202 arranged to receive baseband signals from the baseband processor 12. The mixer is responsible for up-converting the baseband signals to a higher frequency using a local oscillator signal generated by a local oscillator 204. The transmit path may further include a filter 206 for removing baseband components and suppressing harmonics and a power amplifier 208 for amplifying power of the modulated signal. The components in the transmit path are not comprehensive and any person of skill in the art will understand that the specific configuration will depend on the communication standard being adhered to and the chosen architecture implementation.

A known passive CMOS (complementary-symmetry metal-oxide-semiconductor) mixer circuit 300 will now be described with reference to FIG. 3.

The baseband signals are analog signals generated by modulating a baseband carrier with data, in accordance with any known protocol.

The CMOS passive mixer circuit 300 receives differential baseband signals (VBBP, VBBM) from a baseband processor. The term 'differential' is used here to describe that the baseband signals (VBBP, VBBM) have the same amplitude and are substantially in opposite phase to each other, i.e., 180 degrees out of phase. The mixer circuit 300 includes n-type metal oxide semiconductor field effect (NMOS) transistors 302, 304, 306, and 308 that are arranged to receive the baseband signals VBBP and VBBM and differential local oscillator signals (VLOP, VLOM). The NMOS transistors 302, 304, 306, and 308 provide differential outputs VOP and VOM.

Whilst the CMOS passive mixer circuit 300 has been described with respect to NMOS transistors, those skilled in the art will understand that transistors 302, 304, 306, and 308 may be selected to be p-type metal oxide semiconductor field effect (PMOS) transistors.

In operation, the mixer circuit 300 up-converts the baseband signals (VBBP, VBBM) to a desired RF transmit frequency using the local oscillator signals (VLOP, VLOM).

For the passive mixer 300 to operate, the baseband signals are required to drive the passive mixer that has a load at the output with minimum distortion. Any distortion from the baseband processor will degrade the linearity of the passive mixer.

One of the known protocols for RF signaling uses complex in-phase (I) and quadrature phase (Q) signals, where each can be in differential formats.

International Publication WO 2010/025556 discloses an IQ passive mixer 400 with driver circuitry 430 which will now be described with reference to FIG. 4.

The differential baseband input signals for the I and Q paths are labeled VBBQP, VBBQM, VBBIP, and VBBIM. These baseband input signals are input into the driver circuitry 430.

The driver circuitry 430 comprises source follower NMOS transistors 440, 444, 448 and 452 connected to bias NMOS transistors 442, 446, 450 and 454. The gate terminals of source follower NMOS transistors 440, 444, 448 and 452 receive the baseband input signals VBBQP, VBBQM, VBBIP, and VBBIM. The gate terminals of bias NMOS transistors 442, 446, 450 and 454 receive a bias voltage VBIAS. The outputs of the source follower NMOS transistors 440, 444, 448 and 452 are passed through resistors 460, 462, 464, 466 before being provided to the IQ passive mixer 400.

The passive IQ mixer 400 comprises NMOS transistors 402, 404, 406, 408, 410, 412, 414, and 416 for the I/Q paths and supplied by local oscillator signals labelled VLOIP, VLOIM, VLOQP, and VLOQM.

The outputs of the passive IQ mixer 400, namely VOP and VOM, are up-converted frequency signals that can be used to drive an amplifier, for example power amplifier 208 through accoupling capacitors (not shown in FIG. 4), prior to transmission.

The LO signals (VLOIP, VLOIM, VLOQP, and VLOQM) are each a square waveform (SO2 duty cycle) from 0V to 1.2V and are designed to have low rise and fall times. This arrangement enables the omission of surface acoustic wave (SAW) filters that are traditionally used at the transmitter's output. Accordingly, this helps to minimize the number of required external components, the required board area, and hence reduces the overall cost of the chip.

Placing a capacitive load on the outputs of the IQ passive mixer 400 reduces distortion introduced by the source follower NMOS transistors 440, 444, 448 and 452; however the source follower transistors are no longer linear. This limits the linearity of the IQ passive mixer 400.

For a mixer performing an up-conversion frequency translation, a typical specification used is called FRF-3BB (Delta). This is the ratio of the up-converted RF signal to the third order distortion, where the third order distortion is $F_{LO}$-3.$F_{BB}$ ($F_{LO}$ is the local oscillator frequency and $F_{BB}$ is the frequency of the baseband input signal). For a 2G application, a typical Delta of 55 dB is required. For a 3G voice application, a typical Delta of 45 dB is required.

Thus, to have high Delta, the source follower NMOS transistors 440, 444, 448, and 452 shown in FIG. 4 are required to have large transconductance (gm). The transconductance (gm) for a source follower transistor is directly proportional to the drain current $I_D$ of the source follower transistor. Therefore, in order to achieve a high delta value, the current consumption of the source follower transistor must also increase.

The transconductance gm varies with the baseband input signal, due to resulting variations in the drain current. To minimize the effect of the variations, additional resistors 460, 462, 464, and 468 are added in series with the inherent (1/gm) resistance of the source follower NMOS transistors (440, 444, 448, and 452) to improve the linearity of the IQ passive mixer 400.

One trade-off with this design is the value of the resistance of resistors 460, 462, 464, 466 and the Delta value. With a high resistor value, the Delta value increases, however the SNR decreases. Similarly, with a low value resistor the SNR increases, however the Delta value decreases.

It is an aim of the present invention to provide a driver circuit for a mixer circuit with improved linearity.

SUMMARY

According to one aspect, an embodiment provides a driver circuit for supplying a drive signal to a mixer circuit. The driver circuit comprises a first circuit branch, a second circuit branch, and an operational amplifier. The first circuit branch has first and second circuit components arranged to receive respectively an input signal and a bias signal. The second circuit branch has first and second circuit components where the first component is arranged to receive the input signal. The operational amplifier has a first input connected to a junction node of the first and second circuit components of the first circuit branch and a second input connected to a junction node of the first and second circuit components of the second circuit branch. The operational amplifier is arranged to provide an operational amplifier output signal to the second component of the second circuit branch so that a voltage at the junction node of the second circuit branch is equal to a voltage at the junction node of the first circuit branch. The voltage is dependent on the input signal and providing the drive signal.

A further aspect provides an embodiment of a CMOS passive mixer circuit for mixing an input signal with a frequency signal comprising a plurality of transistors, wherein at least one transistor of the plurality of transistors is arranged to receive a drive signal output from a driver circuit. The driver circuit comprises a first circuit branch, a second circuit branch, and an operational amplifier. The first circuit branch has first and second circuit components arranged to receive respectively the input signal and a control signal. The second circuit branch has first and second circuit components where the first component arranged to receive the input signal. The operational amplifier has a first input connected to a junction node of the first and second circuit components of the first circuit branch and a second input connected to a junction node of the first and second circuit components of the second circuit branch. The operational amplifier is arranged to provide an operational amplifier output signal to the second component of the second circuit branch so that a voltage at the junction node of the several circuit branch is equal to a voltage at the junction node of the first circuit branch. The voltage is dependent on the input signal and providing the drive signal to the at least one transistor.

BRIEF DESCRIPTION OF THE DRAWINGS

For a better understanding of the present invention and to show how the same may be put into effect, reference will now be made, by way of example, to the following drawings in which.

DETAILED DESCRIPTION

As discussed herein, by providing an operational amplifier which is connected to show a high impedance to the junction node of the first circuit branch, with the drive signal being provided at the junction node of the second circuit branch, the linearity of the drive circuit can be improved. Where the first circuit branch constitutes transistors in a source follower arrangement, the linearity can be determined by the transconductance of the one of the transistors by varying the bias signal which is supplied to its gate. In this way, current consumption can be programmed.

The driver circuit allows for an input signal at a large amplitude (high power level) without degrading the linearity of the driver circuit, so as to attain high signal-to-noise ratios. In addition, the drivers' current consumption can be reduced substantially while still maintaining good linearity.

In an embodiment of the invention, the driver circuit comprises at least one further circuit branch having first and second circuit components, the first circuit component arranged to receive the first input signal and a second circuit component arranged to receive the operational amplifier output signal. Switching means can be provided for selectively supplying the first transistor of the at least one circuit branch with the first input signal, to thereby control a power level of the drive signal by selecting the number of further circuits branches to be supplied with the first input signal. Thus, instead of having one source follower with a replica circuit for linearization driving a passive mixer, it could drive multiple passive mixers with multiple source followers. This improves the programmability by allowing the up-converted RF output power to be programmed depending on how many passive mixers with drivers are connected in parallel. Thus, a driver circuit in accordance with an embodiment of the invention could have programmable output power with programmable current consumption.

Figure 5A:
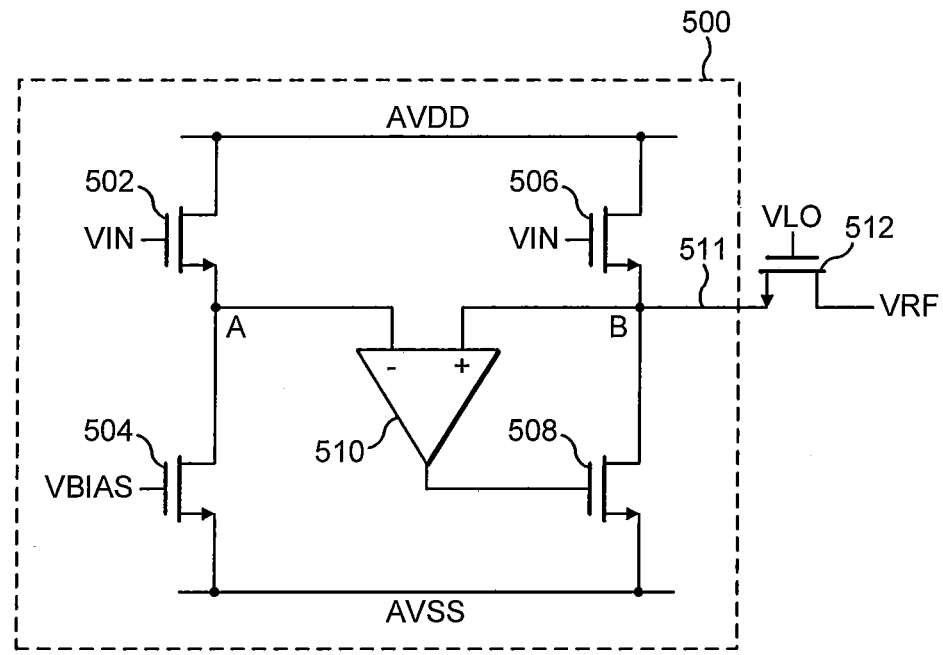
FIG. 5*a* is a circuit diagram of a driver circuit according to one embodiment of the invention using NMOS devices.

A driver circuit according to an embodiment of the present invention will now be described with reference to FIG. 5*a*. As shown in FIG. 5*a*, driver circuit 500 comprises a source follower NMOS transistor 502 connected in series with bias NMOS transistor 504 such that the drain terminal of transistor 502 is connected to a supply voltage AVDD. AVDD may be, for example, 1.2V, however it will be appreciated that other values of AVDD may be used. The source terminal of transistor 502 is connected to the drain terminal of transistor 504 at node A, and the source terminal of transistor 504 is connected to a supply voltage AVSS. The supply voltage AVSS may be 0V. The gate terminal of transistor 502 receives a baseband input signal VIN. The gate terminal of transistor 504 receives a direct-current (DC) bias voltage input signal VBIAS.

Driver circuit 500 further comprises a source follower NMOS transistor 506 connected in series with a transistor 508 such that the drain terminal of transistor 506 is connected to the supply voltage AVDD, the source terminal of transistor 506 is connected to the drain terminal of transistor 508 at node B, and the source terminal of transistor 508 is connected to the supply voltage AVSS. The gate terminal of transistor 506 receives the baseband input signal VIN. The baseband input signal VIN may be one of the differential baseband input signals VBBQP, VBBQM, VBBIP, or VBBIM discussed above with reference to FIG. 4.

Node A is connected to an inverting input of an operational amplifier 510. Node B is connected to a non-inverting input of the operational amplifier 510. The output of operational amplifier 510 is connected to the gate terminal of transistor 508. Node B further provides a drive signal as the output of the driver circuit 500 on line 511. As shown in FIG. 5a, the drive signal may be supplied on line 511 to a transistor 512 which is part of a CMOS passive mixer circuit, e.g., an IQ passive mixer 400 as shown in FIG. 4.

It will be appreciated that a plurality of driver circuits 500 will be required in order to supply each of the baseband input signals VBBQP, VBBQM, VBBIP, or VBBIM to the IQ passive mixer 400.

Figure 1:
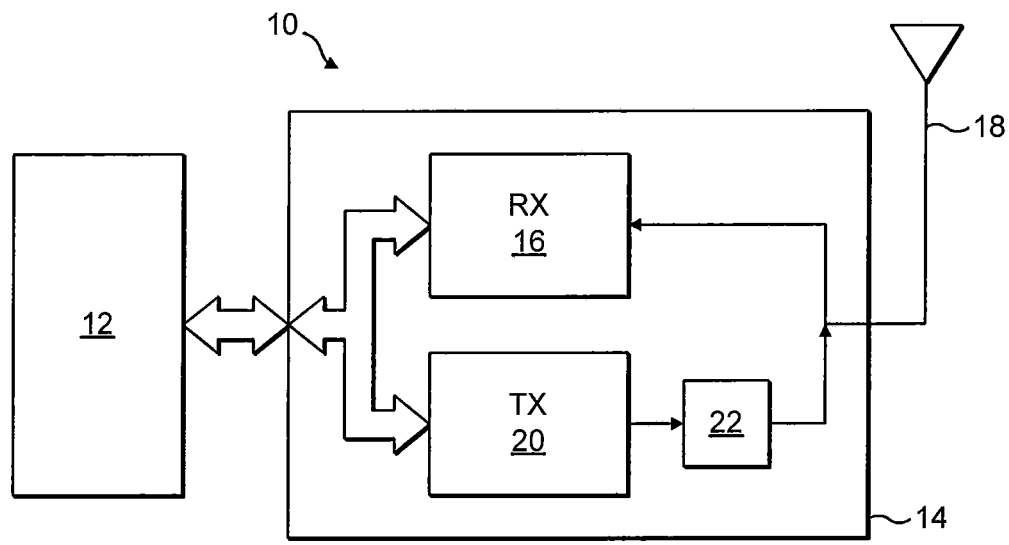
FIG. 1 is block diagram of a wireless core of the prior art.
Figure 2:
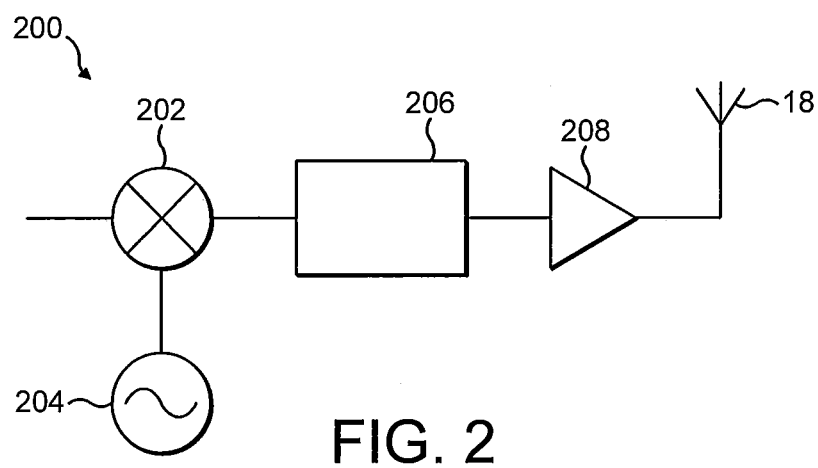
FIG. 2 is a block diagram of transmitter core of a wireless core shown in FIG. 1.
Figure 3:
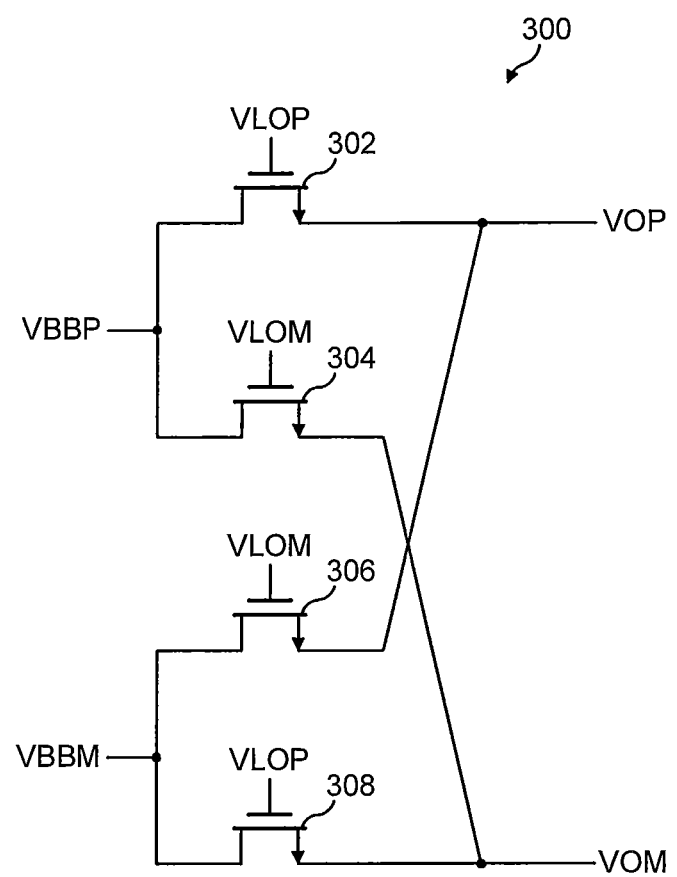
FIG. 3 is a circuit diagram of a passive CMOS mixer circuit of the prior art.
Figure 4:
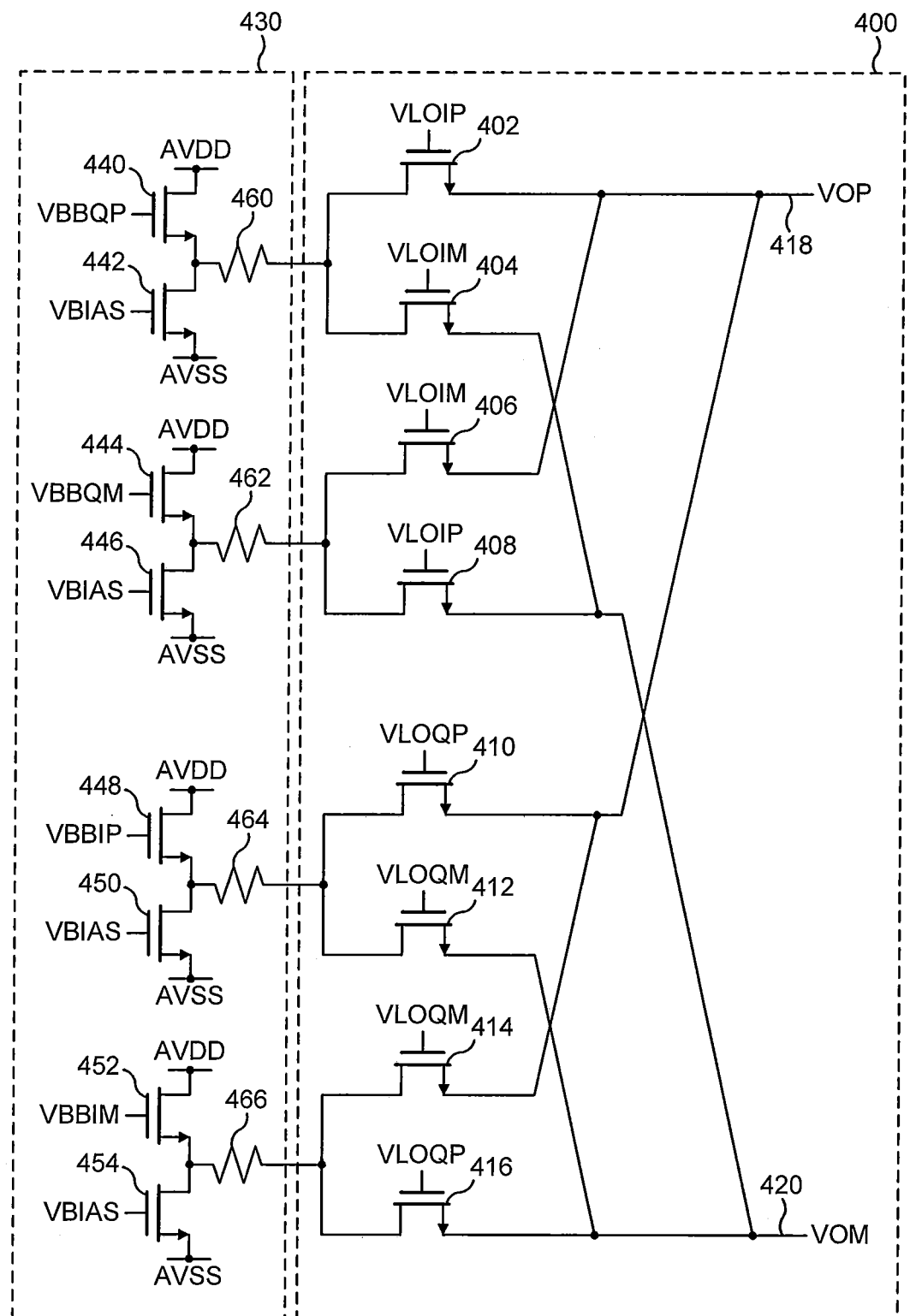
FIG. 4 is a circuit diagram of an IQ mixer circuit and a driver circuit.

Referring to both FIGS. 4 and 5a, driver circuits 500 may replace the source follower NMOS transistor, bias NMOS transistor, and resistor of the driver circuitry 430 on each I and Q path. For example, the source follower NMOS transistor 440, bias NMOS transistor 442, and the resistor 460 may be replaced by the driver circuit 500 wherein the source follower NMOS transistor 502 would receive the baseband input signal VBBQP at its gate terminal.

In the driver circuitry 430 shown in FIG. 4, due to the direct-current (DC) bias voltage input signal VBIAS, the bias NMOS transistors 442, 446, 450, 454 are constant current sources which, because they receive a constant bias voltage, sink a constant current.

In operation of the driver circuit 500, the operational amplifier 510 is used to copy node voltage A to node B by controlling the gate terminal of transistor 508. The output voltage at node B is then used to drive transistor 512 in the CMOS passive mixer circuit directly. The source follower NMOS transistor 506, transistor 508, and operational amplifier 510 act like a class-AB driver driving the passive mixer in the sense that the length of time (proportion of the input signal) during which current flows through the transistor 508 is around 50%. The source follower NMOS transistor 506 acts to source AC current into the transistor 512 and transistor 508 is used to sink AC current from transistor 512.

This has advantages over the source follower discussed above with a constant current source, because the constant current source can only sink a constant current and is thus required to be biased at high current to ensure linearity during operation.

In the driver circuit 500, the bias NMOS transistor 504 controls the bias current of transistor 502. The voltage at node A is not used to drive a transistor of the CMOS passive mixer, but instead sees the high impedance of the op-amp. The voltage at node B, which has been copied from the voltage at node A using the operational amplifier 510, is used to drive a transistor of the CMOS passive mixer. The transistor 508 does not receive a direct-current (DC) bias voltage input signal VBIAS at its gate terminal, but the output of the op-amp, which is of a varying magnitude of current. The magnitude of current at the output of the operational amplifier 510 varies in dependence on the input signal and the amount of DC current flowing through transistor 508. The higher the DC current, the better the linearity you get from the source follower transistor 506.

Note that since a resistor (i.e., one of resistors 460, 462, 464, 468 described with reference to FIG. 4) is not required in this case, no trade-off between linearity and SNR is required. Furthermore, since the source follower transistor 502 output (node A) does not need to drive the CMOS passive mixer with a load directly, the passive mixer circuit can achieve very high linearity. This makes the present invention more robust such that it solves the above mentioned problems of attaining a highly linear CMOS passive mixer that achieves high Delta and SNR simultaneously.

The linearity in this case which is mainly determined by the transconductance of transistor 502 could be programmed easily by changing the bias current through transistor 502. The bias current through transistor 502 can be changed by changing the DC bias voltage VBIAS or connecting additional bias transistors in parallel with bias transistor 504. This makes the driver circuit 500 highly flexible and thus could be used for example in $2^{nd}$ generation (2G) and $3^{rd}$ generation (3G) applications with no extra hardware which results in less silicon area being used and less complexity in the design. Those skilled in the art will appreciate which telecommunication standards are referred to as 2G and 3G.

Figure 5B:
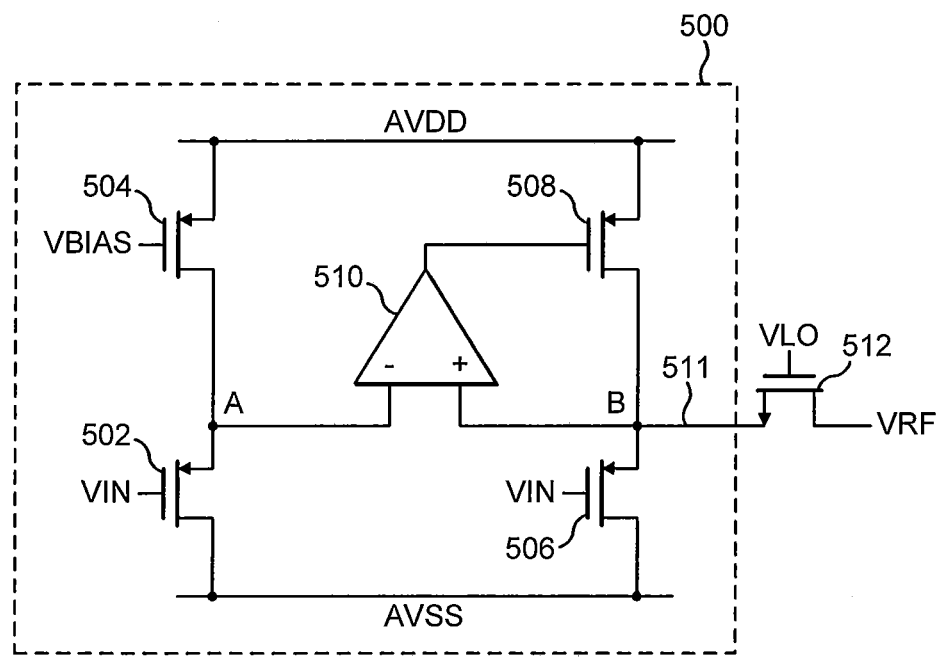
FIG. 5*b* is a circuit diagram of a driver circuit according to one embodiment of the invention using PMOS devices.

Whilst the driver circuit 500 has been described using NMOS transistors, it will be appreciated that source follower transistors 502, 506 and bias transistors 504, 508 may be PMOS devices. FIG. 5b shows the driver circuit 500 using PMOS devices.

Whilst it has been described above that a plurality of driver circuits 500 may be used to provide the baseband input signals VBBQP, VBBQM, VBBIP, and VBBIM to a single IQ passive mixer, for example mixer 400 in FIG. 4, a modification to the driver circuit 500 shown in FIG. 5a will now be described with reference to FIG. 6 that allows for a single baseband input signal to be provided to multiple IQ passive mixers.

Figure 6:
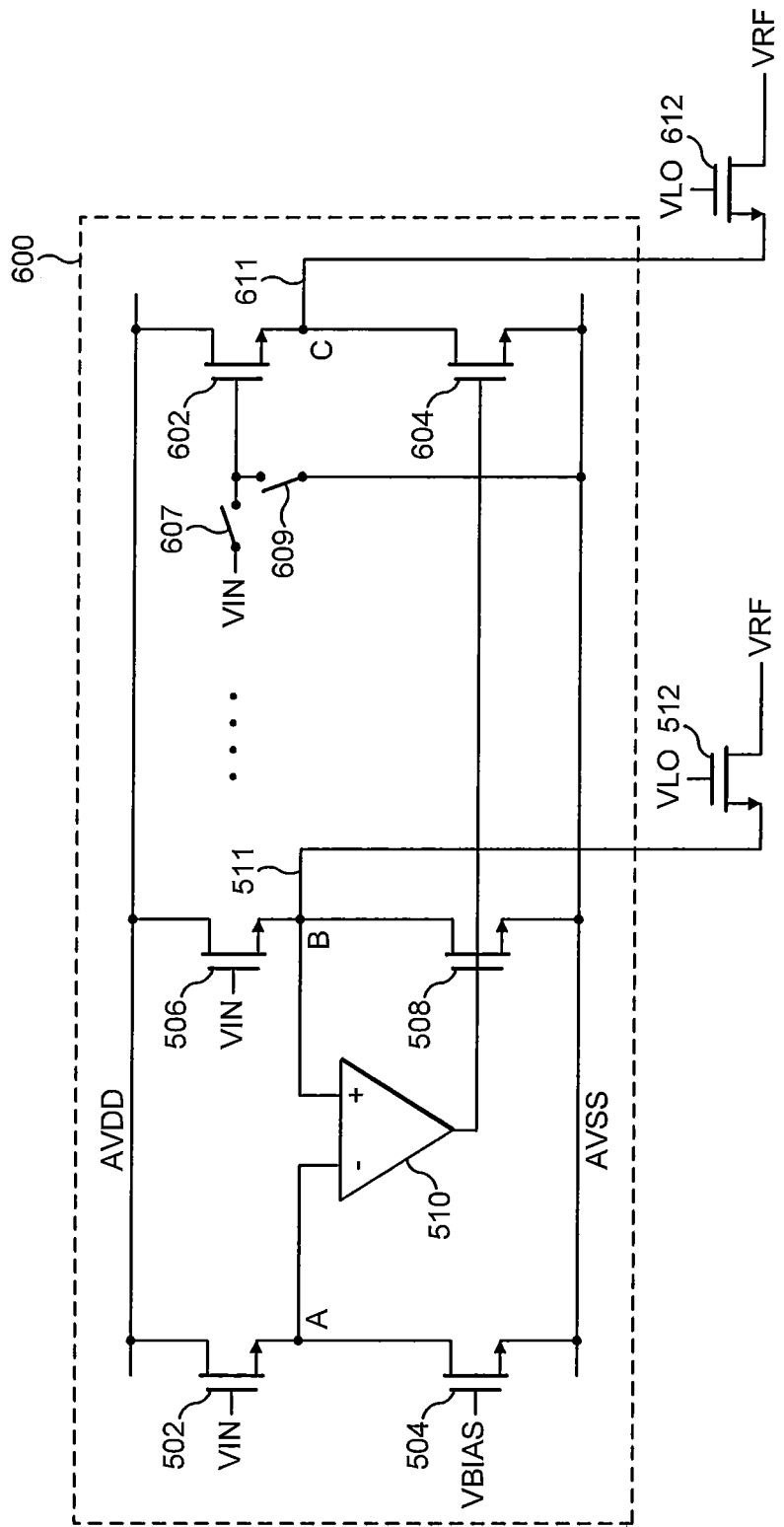
FIG. 6 is a circuit diagram of a driver circuit according to another embodiment of the invention.

As shown in FIG. 6 driver circuit 600 includes driver circuit 500 and a plurality of additional circuit branches. The circuit elements of one of the additional circuit branches have been shown in FIG. 6 for simplicity.

Each additional circuit branch include a source follower NMOS transistor 602 connected in series with a bias NMOS transistor 604 such that the drain terminal of source follower NMOS transistor 602 is connected to the supply voltage AVDD, the source terminal of source follower NMOS transistor 602 is connected to the drain terminal of bias NMOS transistor 604 at node C, and the source terminal of bias NMOS transistor 604 is connected to the supply voltage AVSS. The gate terminal of source follower NMOS transistor 602 receives the baseband input signal VIN. This is the same baseband input signal that is supplied to the gate terminals of transistors 502 and 506. The output of operational amplifier 510 is connected to the gate terminal of bias NMOS transistor 604. Node C further provides a drive signal as the output of the driver circuit 600 on line 611.

As shown in FIG. 6, the drive signal may be supplied on line 611 to a transistor 612 which is part of a CMOS passive mixer, for example an IQ passive mixer circuit 400 as shown in FIG. 4. It is important to note that transistor 512 and transistor 612 are not part of the same CMOS passive mixer circuit. In this way the driver circuit 600 may supply the baseband input signal VIN to a plurality of transistors, whereby each of the plurality of transistors is part of separate CMOS passive mixer circuits.

Each additional circuit branch further includes switches 607 and 609 that are used to control the input of the transistor 602. Only one of the switches 607 and 609 may be turned on at one time. When switch 607 is turned on, the gate terminal of transistor 602 is supplied with the baseband input signal VIN. When switch 609 is turned on, the gate terminal of transistor 602 is connected to the supply voltage AVSS. The supply voltage AVSS may be 0V. When the switch 607 is turned on, baseband input signal VIN will be supplied to the source terminal of transistor 612 and when the switch 609 is turned on, the baseband input signal VIN will not be supplied to the source terminal of transistor 612.

It will be appreciated that any number of additional circuit branches may be implemented in the driver circuit 600 so that any number of IQ passive mixer circuits may be supplied with the baseband input signal VIN. Furthermore, given the control of the switches on each of the additional circuit branches, the driver circuit 600 enables highly programmable IQ passive mixer circuits.

Using the driver circuit 600, the power levels of the up-converted RF output signal (VRF) in the respective IQ passive mixer circuits could be programmed depending on how many IQ passive mixers with driver circuits 600 are connected in parallel. Thus, this invention could have programmable output powers with programmable current consumptions.

Whilst the circuit modification has been described above with reference to the driver circuit 500 shown in FIG. 5a, it will be appreciated that the circuit modification may also be made to the driver circuit 500 (using PMOS devices) shown in FIG. 5b.

While this invention has been particularly shown and described with reference to shown embodiments, it will be understood to those skilled in the art that various changes in form and detail may be made without departing from the scope of the invention as defined by the appendant claims.

The invention claimed is:

1. A driver circuit for supplying a drive signal to a mixer circuit, the driver circuit comprising:
    a first circuit branch having first and second circuit components arranged to receive respectively an input signal and a bias signal, wherein the bias signal is variable to control the linearity of the driver circuit;
    a second circuit branch having first and second circuit components, the first component arranged to receive the input signal; and
    an operational amplifier having a first input connected to a junction node of the first and second circuit components of the first circuit branch and a second input connected to a junction node of the first and second circuit components of the second circuit branch, the operational amplifier arranged to provide an operational amplifier output signal to the second component of the second circuit branch so that a voltage at the junction node of the second circuit branch is equal to a voltage at the junction node of the first circuit branch, said voltage dependent on said input signal and providing said drive signal.

2. The driver circuit according to claim 1, wherein the first and second components of the first and second circuit branch are first and second transistors connected in series.

3. The driver circuit according to claim 2, wherein the first transistor of the first circuit branch has a gate arranged to receive the first input signal, and the second transistor of the first circuit branch has a gate arranged to receive the bias signal.

4. The driver circuit according to claim 2, wherein the first transistor of the second circuit branch is arranged to receive the first input signal, and the second transistor of the second circuit branch is arranged to receive the operational amplifier output signal.

5. The driver circuit according to claim 2, wherein the first and second transistors are all NMOS devices.

6. The driver circuit according to claim 2, wherein the first and second transistors are all PMOS devices.

7. The driver circuit according to claim 1, wherein the first input of the operational amplifier is an inverting input and the second input of the operational amplifier is a non-inverting input.

8. The driver circuit according to claim 1, wherein the input signal is a baseband input signal.

9. The driver circuit according to claim 1, further comprising at least one further circuit branch having first and second circuit components, the first circuit component arranged to receive the first input signal and the second circuit component arranged to receive the operational amplifier output signal.

10. The driver circuit according to claim 9, wherein the first and second circuit components of the at least one further circuit branch are first and second transistors connected in series.

11. The driver circuit according to claim 10, wherein the first and second transistors are all NMOS devices.

12. The driver circuit according to claim 10, wherein the first and second transistors are all PMOS devices.

13. The driver circuit according to claim 10, wherein the at least one further circuit branch comprises switching means for selectively supplying the first transistor of the at least one circuit branch with the first input signal, to thereby control a power level of the drive signal by selecting the number of further circuit branches to be supplied with the first input signal.

14. The driver circuit according to claim 13, wherein the switching means comprises a first and second switch configured to control an input of the first transistor of the at least one circuit branch, wherein when the first switch is turned on the first transistor is supplied with the first input signal and when the second switch is turned on the first transistor is connected to a voltage supply rail, the first and second switch arranged such that only one of the first and second switch may be turned on at one time.

15. A CMOS passive mixer circuit for mixing an input signal with a frequency signal comprising a plurality of transistors, wherein at least one transistor of the plurality of transistors is arranged to receive a drive signal output from a driver circuit, the driver circuit comprising:
    a first circuit branch having first and second circuit components arranged to receive respectively the input signal and a control signal;
    a second circuit branch having first and second circuit components, the first component arranged to receive the input signal; and
    an operational amplifier having a first input connected to a junction node of the first and second circuit components of the first circuit branch and a second input connected to a junction node of the second circuit branch, the operational amplifier arranged to provide an operational amplifier output signal to the second component of the second circuit branch so that a voltage at the junction node of the several circuit branch is equal to a voltage at the junction node of the first circuit branch, said voltage dependent on said input signal and providing said drive signal to the at least one transistor.

* * * * *